(12) United States Patent
Park et al.

(10) Patent No.: US 8,460,968 B2
(45) Date of Patent: Jun. 11, 2013

(54) INTEGRATED CIRCUIT PACKAGING SYSTEM WITH POST AND METHOD OF MANUFACTURE THEREOF

(75) Inventors: DongSam Park, Seongnam-si (KR); HanGil Shin, Seongnam-si (KR); HeeJo Chi, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 392 days.

(21) Appl. No.: 12/885,137

(22) Filed: Sep. 17, 2010

(65) Prior Publication Data

US 2012/0068332 A1 Mar. 22, 2012

(51) Int. Cl.
*H01L 21/16* (2006.01)

(52) U.S. Cl.
USPC .......................................... 438/109; 257/737

(58) Field of Classification Search
USPC ........... 257/737, E21.705, E21.502, E23.079, 257/678; 438/109, 127, 124, 125, 123
See application file for complete search history.

(56) References Cited

U.S. PATENT DOCUMENTS

| | | | |
|---|---|---|---|
| 6,348,728 B1 | 2/2002 | Aiba et al. |
| 7,345,361 B2 | 3/2008 | Mallik et al. |
| 2008/0006942 A1 | 1/2008 | Park et al. |
| 2008/0230887 A1 | 9/2008 | Sun et al. |

*Primary Examiner* — Julio J Maldonado
*Assistant Examiner* — Robert Bachner
(74) *Attorney, Agent, or Firm* — Ishimaru & Associates LLP; I-Chang John Yang (57) ABSTRACT

A method of manufacture of an integrated circuit packaging system includes: providing a stack substrate with a component side; connecting an integrated circuit component to the component side; attaching a conductive post to the component side and adjacent the integrated circuit component, the conductive post having a protruded end above the integrated circuit component; forming a protection layer on a top and sides of the protruded end, the protection layer having a width equal to a width of the conductive post; applying a stack encapsulation over the integrated circuit component, over the stack substrate, and around a portion of the conductive post, the protection layer exposed from the stack encapsulation; and mounting a base package under the stack substrate, base package connected to the stack substrate.

20 Claims, 7 Drawing Sheets

INTEGRATED CIRCUIT PACKAGING SYSTEM WITH POST AND METHOD OF MANUFACTURE THEREOF

TECHNICAL FIELD

The present invention relates generally to an integrated circuit packaging system, and more particularly to a system with post.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a stack substrate with a component side; connecting an integrated circuit component to the component side; attaching a conductive post to the component side and adjacent the integrated circuit component, the conductive post having a protruded end above the integrated circuit component; forming a protection layer on a top and sides of the protruded end, the protection layer having a width equal to a width of the conductive post; applying a stack encapsulation over the integrated circuit component, over the stack substrate, and around a portion of the conductive post, the protection layer exposed from the stack encapsulation; and mounting a base package under the stack substrate, base package connected to the stack substrate.

The present invention provides an integrated circuit packaging system, including: a stack substrate with a component side; an integrated circuit component connected to the component side; a conductive post connected to the component side and adjacent the integrated circuit component, the conductive post having a protruded end above the integrated circuit component; a protection layer on the protruded end, the protection layer having a width equal to a width of the conductive post; a stack encapsulation over the integrated circuit component, over the stack substrate, and around a portion of the conductive post, the protection layer exposed from the stack encapsulation; and a base package under the stack substrate, the base package connected to the stack substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
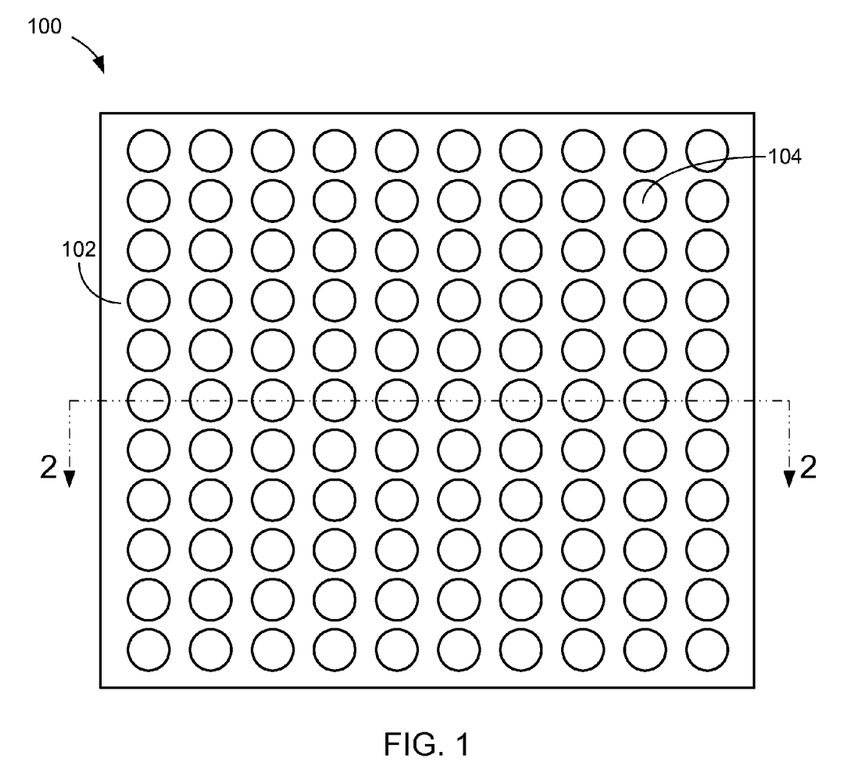
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The integrated circuit packaging system 100 includes a base substrate 102 having system interconnects 104 exposed on the base substrate 102.

The base substrate 102 can include a substrate, an interposer, a circuit board, or a laminate having a conductive material to provide connectivity between and within sides of the base substrate 102. The system interconnects 104 can include balls or bumps from a conductive material or solder.

Figure 2:
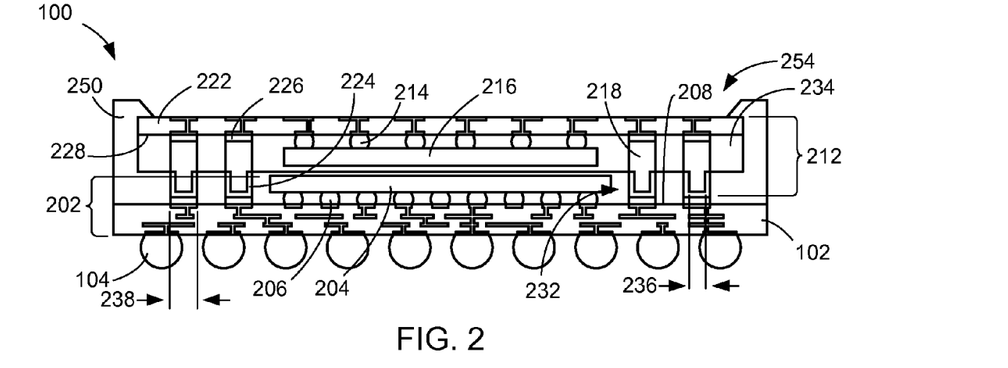
FIG. 2 is a cross-sectional view of FIG. 1 taken along line 2-2.

Referring now to FIG. 2, therein is shown a cross-sectional view of FIG. 1 taken along line 2-2. The integrated circuit packaging system 100 includes a base package 202 having an integrated circuit device 204, such as a flip chip, connected to the base substrate 102 using device connectors 206 that can include conductive balls or bumps. The device connectors 206 can be formed from a solder material.

The device connectors 206 on a device active side of the integrated circuit device 204 can be directly connected to an internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 204 opposite the device active side can be facing away from the base substrate 102. The system interconnects 104 can be attached to a side of the base substrate 102 opposite the internal side 208 of the base package 202 to provide connectivity between the integrated circuit packaging system 100 and a next level subsystem (not shown) including a printed circuit board, an integrated circuit package, or an electronic subsystem.

A stack package 212 can be connected directly to the base package 202. The stack package 212 can include circuit connectors 214, an integrated circuit component 216, conductive posts 218, a stack substrate 222, a protection layer 224, and a conductive layer 226.

The integrated circuit component 216 can include a die or flip chip connected to a component side 228 of the stack substrate 222 using the circuit connectors 214, similar to the device connectors 206. The conductive posts 218 can be formed from a conductive metal leadframe having protruded ends 232. Ends of the conductive posts 218 opposite the protruded ends 232 are attached or connected to the component side 228 using the conductive layer 226 that can include a solder, a solder paste, a conductive adhesive, or a combination thereof.

The conductive posts 218 can be positioned on the component side 228 outside a peripheral region of the integrated circuit component 216. A stack encapsulation 234 covers the integrated circuit component 216, the component side 228, and surround each of the conductive posts 218 with the protruded ends 232 of the conductive posts 218 exposed from the stack encapsulation 234. The stack encapsulation 234 protects the stack package 212 by providing structural support, and hermetically sealing the contents of the stack package 212.

A protrusion width 236 is defined as a maximum cross-sectional width of the protruded ends 232. A post width 238 is defined as a maximum cross-sectional width of the conductive posts 218 in direct contact with the stack encapsulation 234. The protrusion width 236 is less than the post width 238 for each of the conductive posts 218.

The protection layer 224, which is a layer of etchant resistant and conductive materials, can be applied directly on the protruded ends 232 using an etching protection layer, an adhesion layer, a diffusion barrier layer, a wet enhancing layer, or any combination thereof. The protection layer 224 can preferably be formed on a top and sides of the protruded ends 232. For example, the etchant resistant materials can include a gold, a nickel a gold, nickel lead gold, or etchant resistant alloys. A cross-sectional width of the protection layer 224 on the protruded ends 232 can preferably be equal to the post width 238.

The conductive layer 226 can be attached directly between the protruded ends 232 of the stack package 212 and the internal side 208 of the base substrate 102. The conductive layer 226 provides connectivity between the stack package 212 and the base package 202.

A package encapsulation 250 can be applied between the stack package 212 and the base package 202, surrounding each of the protruded ends 232, and covering peripheral sides of the stack package 212 and the stack encapsulation 234. The package encapsulation 250 can be similar to the stack encapsulation 234.

An inner perimeter of a side of the stack substrate 222 opposite the component side 228 and facing away from the base package 202 is exposed from the package encapsulation 250 to form a cavity 254. Conductive material on the stack substrate 222 and exposed in the cavity 254 of the package encapsulation 250 can provide connectivity between the integrated circuit packaging system 100 and the next level subsystem or a further next level subsystem (not shown).

For purposes of illustration, the stack substrate 222 is shown having a single conductive layer connecting the component side 228 with the side of the stack substrate 222 opposite the component side 228. It is understood that the stack substrate 222 can have any number of conductive layers. For example, the stack substrate 222 can have five conductive layers used to route and connect different areas on the component side 228 with areas on the side of the stack substrate 222 opposite the component side 228.

It has been discovered that the stack substrate 222 with the conductive posts 218 results in the integrated circuit packaging system 100 having reduced package heights by the conductive posts 218 providing robust electrical and mechanical connections to the base substrate 102 while providing clearance for the integrated circuit device 204.

For example, a package having an exposed solder on pad internal stacking module interposer (e-SOP ISM interposer) does not require any wire bonding or exposed wire resulting in a reduced total package height.

It has been discovered that the stack substrate 222 with the conductive posts 218 reduces the number of manufacturing process steps by having an exposed solder on pad internal stacking module interposer (e-SOP ISM interposer) does not require any wire bonding process steps.

It has been discovered that the stack substrate 222 with the conductive posts 218 eliminates voids within the integrated circuit packaging system 100 by not requiring a spacer die and thus eliminates any occurrence of voids.

It has been discovered that the conductive posts 218 and the conductive layer 226 provides higher packaging density. For example, fan in package on package (Fi-PoP) or package in package (PiP) packages having the conductive posts 218 and the conductive layer 226 have higher package densities than conventional Fi-POP or PiP packages, respectively.

It has been discovered that the conductive posts 218 enable the integrated circuit packaging system 100 to have finer pitched interconnects by the conductive posts 218 providing a finer interconnect pitch than packages using vertical interconnects formed using solder.

It has been discovered that the conductive posts 218 reduce occurrences of bumped bridging during reflow in comparison to vertical interconnects formed using solder thereby increasing reliability and yield.

Figure 3:
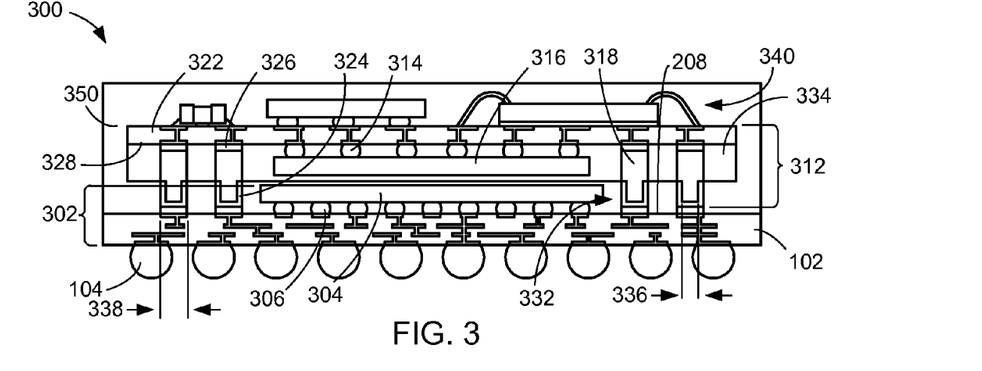
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 includes a base package 302 with the base substrate 102 having the system interconnects 104 exposed on a side of the base substrate 102.

The base package 302 includes an integrated circuit device 304, such as a flip chip, connected to a side of the base substrate 102 opposite the side with the system interconnects 104 using device connectors 306 that can include conductive balls or bumps. The device connectors 306 can be formed from a solder material.

The device connectors 306 on a device active side of the integrated circuit device 304 can be directly connected to the internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 304 opposite the device active side can be facing away from the base substrate 102. The system interconnects 104 can be attached to a side of the base substrate 102 opposite the internal side 208 of the base package 302 to provide connectivity between the integrated circuit packaging system 300 and a next level subsystem (not shown) including a printed circuit board, an integrated circuit package, or an electronic subsystem.

A stack package 312 can be connected directly to the base package 302. The stack package 312 can include circuit connectors 314, an integrated circuit component 316, conductive posts 318, a stack substrate 322, a protection layer 324, and a conductive layer 326.

The integrated circuit component 316 can include a die or flip chip connected to a component side 328 of the stack substrate 322 using the circuit connectors 314, similar to the device connectors 306. The conductive posts 318 can be formed from a conductive metal leadframe having protruded ends 332. Ends of the conductive posts 318 opposite the protruded ends 332 are attached to the component side 328 using the conductive layer 326 that can include a solder, a solder paste, a conductive adhesive, or a combination thereof.

The conductive posts 318 can be positioned on the component side 328 outside a peripheral region of the integrated circuit component 316. A stack encapsulation 334 covers the integrated circuit component 316, the component side 328, and surround each of the conductive posts 318 with the protruded ends 332 of the conductive posts 318 exposed from the stack encapsulation 334. The stack encapsulation 334 protects the stack package 312 by providing structural support, and hermetically sealing the contents of the stack package 312.

A protrusion width 336 is defined as a maximum cross-sectional width of the protruded ends 332. A post width 338 is defined as a maximum cross-sectional width of the conductive posts 318 in direct contact with the stack encapsulation 334. The protrusion width 336 is less than the post width 338 for each of the conductive posts 318.

The protection layer 324, which is a layer of etchant resistant materials, can be applied directly on the protruded ends 332 using an etching protection layer, an adhesion layer, a diffusion barrier layer, a wet enhancing layer, or any combination thereof. The protection layer 324 can preferably be formed on a top and sides of the protruded ends 332. For example, the etchant resistant materials can include a gold, a nickel a gold, nickel lead gold, or etchant resistant alloys. A cross-sectional width of the protection layer 324 on the protruded ends 332 can preferably be equal to the post width 338.

The conductive layer 326 can be attached directly between the protruded ends 332 of the stack package 312 and the internal side 208 of the base substrate 102. The conductive layer 326 provides connectivity between the stack package 312 and the base package 302.

Electronic components 340 can be electrically connected or attached to a side of the stack substrate 322 opposite the component side 328. The electronic components 340 can include passive devices, flip chips, wire bond chips, or components having integrated circuitry.

A package encapsulation 350 can surround each of the protruded ends 332, cover the electronic components 340, and be applied between the stack package 312 and the base package 302. The package encapsulation 350 can be formed in a manner similar to the stack encapsulation 334 and cover peripheral sides of the stack package 312.

For purposes of illustration, the stack substrate 322 is shown having a single conductive layer connecting the component side 328 with the side of the stack substrate 322 opposite the component side 328. It is understood that the stack substrate 322 can have any number of conductive layers. For example, the stack substrate 322 can have five conductive layers used to route and connect different areas on the component side 328 with areas on the side of the stack substrate 322 opposite the component side 328.

Figure 4:
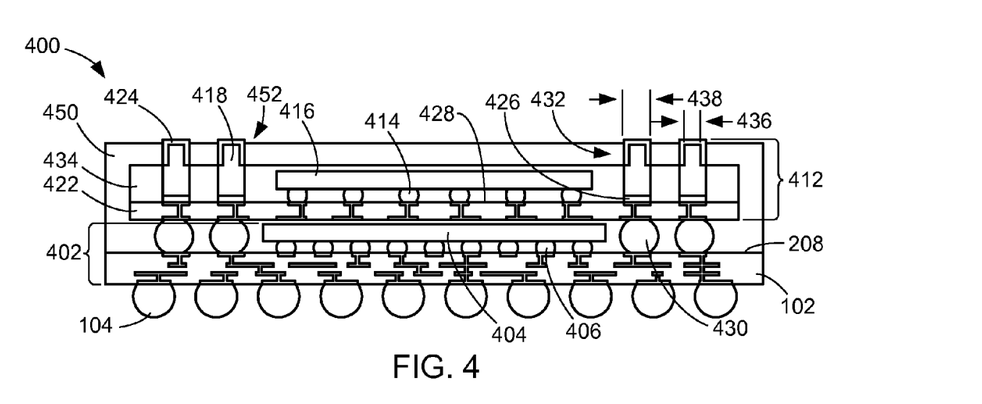
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 includes a base package 402 with the base substrate 102 having the system interconnects 104 exposed on a side of the base substrate 102.

The base package 402 includes an integrated circuit device 404, such as a flip chip, connected to a side of the base substrate 102 opposite the side of the base package 402 with the system interconnects 104 using device connectors 406 that can include conductive balls or bumps. The device connectors 406 can be formed from a solder material.

The device connectors 406 on a device active side of the integrated circuit device 404 can be directly connected to the internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 404 opposite the device active side can be facing away from the base substrate 102. The system interconnects 104 attached to a side of the base substrate 102 opposite the internal side 208 can provide connectivity between the integrated circuit packaging system 400 and a next level subsystem (not shown) including a printed circuit board, an integrated circuit package, or an electronic subsystem.

A stack package 412 can be connected directly to the base package 402. The stack package 412 can include circuit connectors 414, an integrated circuit component 416, conductive posts 418, a stack substrate 422, a protection layer 424, and a conductive layer 426.

The integrated circuit component 416 can include a die or flip chip connected to a component side 428 of the stack substrate 422 using the circuit connectors 414, similar to the device connectors 406. The conductive posts 418 can be formed from a conductive metal leadframe having protruded ends 432. Ends of the conductive posts 418 opposite the protruded ends 432 are attached to the component side 428 using the conductive layer 426 that can include a solder, a solder paste, a conductive adhesive, or a combination thereof.

The conductive posts 418 can be positioned on the component side 428 outside a peripheral region of the integrated circuit component 416. A stack encapsulation 434 covers the integrated circuit component 416, the component side 428, and surround each of the conductive posts 418 with the protruded ends 432 of the conductive posts 418 exposed from the stack encapsulation 434. The stack encapsulation 434 can be used to protect the stack package 412 by providing structural support, and hermetically sealing the contents of the stack package 412.

A protrusion width 436 is defined as a maximum cross-sectional width of the protruded ends 432. A post width 438 is defined as a maximum cross-sectional width of the conductive posts 418 in direct contact with the stack encapsulation 434. The protrusion width 436 is less than the post width 438 for each of the conductive posts 418.

The protection layer 424 of etchant resistant materials can be applied directly on the protruded ends 432 using an etching protection layer, an adhesion layer, a diffusion barrier layer, a wet enhancing layer, or any combination thereof. The protection layer 424 can preferably be formed on a top and sides of the protruded ends 432. For example, the etchant resistant materials can include a gold, a nickel a gold, nickel lead gold, or etchant resistant alloys.

A cross-sectional width of the protection layer 424 on the protruded ends 432 can be equal to the post width 438. A side of the stack substrate 422 opposite the component side 428 can be facing and connected to the internal side 208 of the base substrate 102 using stack interconnects 430 that can include solder balls or solder columns having different sizes.

A package encapsulation 450 can surround a portion of each of the protruded ends 432, cover the stack encapsulation 434, and be applied between the stack package 412 and the base package 402. The package encapsulation 450 can be formed in a manner similar to the stack encapsulation 434 and cover peripheral sides of the stack package 412.

An end portion 452 of the protruded ends 432 can be exposed above the package encapsulation 450. The end portion 452 of the protruded ends 432 exposed above the package encapsulation 450 can provide connectivity between the integrated circuit packaging system 400 and the next level subsystem or a further next level subsystem (not shown).

For purposes of illustration, the stack substrate 422 is shown having a single conductive layer connecting the component side 428 with the side of the stack substrate 422 opposite the component side 428. It is understood that the stack substrate 422 can have any number of conductive layers. For example, the stack substrate 422 can have five conductive layers used to route and connect different areas on the component side 428 with areas on the side of the stack substrate 422 opposite the component side 428.

It has been discovered that the stack substrate 422 with the conductive posts 418 provides improved reliability and testability of the integrated circuit packaging system 400 by having an exposed solder on pad internal stacking module interposer (e-SOP ISM interposer) can be tested and verified as a known good package (KGP).

Figure 5:
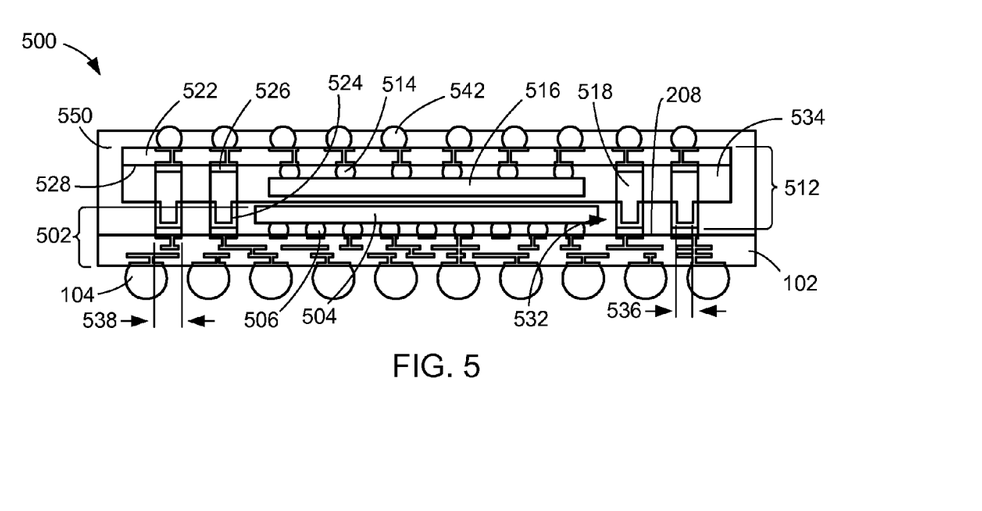
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 includes a base package 502 with the base substrate 102 having the system interconnects 104 exposed on a side of the base substrate 102.

The base package 502 includes an integrated circuit device 504 or a flip chip connected to a side of the base substrate 102 opposite the side of the base package 502 with the system interconnects 104 using device connectors 506 that can include conductive balls or bumps. The device connectors 506 can be formed from a solder material.

The device connectors 506 on a device active side of the integrated circuit device 504 can be directly connected to the internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 504 opposite the device active side can be facing away from the base substrate 102. The system interconnects 104 attached to a side of the base substrate 102 opposite the internal side 208 can provide connectivity between the integrated circuit packaging system 500 and a next level subsystem (not shown) including a printed circuit board, an integrated circuit package, or an electronic subsystem.

A stack package 512 can be connected directly to the base package 502. The stack package 512 can include circuit connectors 514, an integrated circuit component 516, conductive posts 518, a stack substrate 522, a protection layer 524, and a conductive layer 526.

The integrated circuit component 516 can include a die or flip chip connected to a component side 528 of the stack substrate 522 using the circuit connectors 514, similar to the device connectors 506. The conductive posts 518 can be formed from a conductive metal leadframe having protruded ends 532. Ends of the conductive posts 518 opposite the protruded ends 532 are attached to the component side 528 using the conductive layer 526 that can include a solder, a solder paste, a conductive adhesive, or a combination thereof.

The conductive posts 518 are positioned on the component side 528 outside a peripheral region of the integrated circuit component 516. A stack encapsulation 534 covers the integrated circuit component 516, the component side 528, and surround each of the conductive posts 518 with the protruded ends 532 of the conductive posts 518 exposed from the stack encapsulation 534. The stack encapsulation 534 can be used to protect the stack package 512 by providing structural support, and hermetically sealing the contents of the stack package 512.

A protrusion width 536 is defined as a maximum cross-sectional width of the protruded ends 532. A post width 538 is defined as a maximum cross-sectional width of the conductive posts 518 in direct contact with the stack encapsulation 534. The protrusion width 536 is less than the post width 538 for each of the conductive posts 518.

The protection layer 524 of etchant resistant materials can be applied directly on the protruded ends 532 using an etching protection layer, an adhesion layer, a diffusion barrier layer, a wet enhancing layer, or any combination thereof. The protection layer 524 can preferably be formed on a top and sides of the protruded ends 532. For example, the etchant resistant materials can include a gold, a nickel a gold, nickel lead gold, or etchant resistant alloys. A cross-sectional width of the protection layer 524 on the protruded ends 532 can preferably be equal to the post width 538.

The conductive layer 526 can be attached directly between the protruded ends 532 of the stack package 512 and the internal side 208 of the base substrate 102. The conductive layer 526 provides connectivity between the stack package 512 and the base package 502. Package conductors 542 can be electrically connected or attached to a side of the stack substrate 522 opposite the component side 528.

A package encapsulation 550 can surround the package conductors 542 and include solder or exposed solder on pads (eSOP). The package encapsulation 550 covers each of the protruded ends 532, the electronic components 540, and be applied between the stack package 512 and the base package 502.

The package encapsulation 550 can be formed in a manner similar to the stack encapsulation 534 and cover peripheral sides of the stack package 512. A portion of the package conductors 542 is exposed from the package encapsulation 550. The package conductors 542 exposed from the package encapsulation 550 can provide connectivity between the integrated circuit packaging system 500 and the next level subsystem or a further next level subsystem (not shown).

For purposes of illustration, the stack substrate 522 is shown having a single conductive layer connecting the component side 528 with the side of the stack substrate 522 opposite the component side 528. It is understood that the stack substrate 522 can have any number of conductive layers. For example, the stack substrate 522 can have five conductive layers used to route and connect different areas on the component side 528 with areas on the side of the stack substrate 522 opposite the component side 528.

Figure 6:
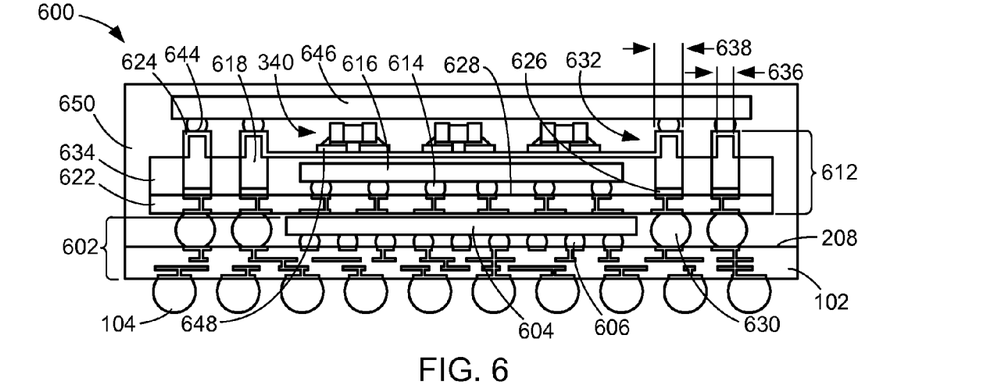
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 includes a base package 602 with the base substrate 102 having the system interconnects 104 exposed on a side of the base substrate 102.

The base package 602 includes an integrated circuit device 604, such as flip chip, connected to a side of the base substrate 102 opposite the side of the base package 602 with the system interconnects 104 using device connectors 606 that can include conductive balls or bumps. The device connectors 606 can be formed from a solder material.

The device connectors 606 on a device active side of the integrated circuit device 604 can be directly connected to the internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 604 opposite the device active side can be facing away from the base substrate 102. The system interconnects 104 attached to a side of the base substrate 102 opposite the internal side 208 can provide connectivity between the integrated circuit packaging system 600 and a next level subsystem (not shown) including a printed circuit board, an integrated circuit package, or an electronic subsystem.

A stack package 612 can be connected directly to the base package 602. The stack package 612 can include circuit connectors 614, an integrated circuit component 616, conductive posts 618, a stack substrate 622, a protection layer 624, and a conductive layer 626.

The integrated circuit component 616 can include a die or flip chip connected to a component side 628 of the stack substrate 622 using the circuit connectors 614, similar to the device connectors 606. The conductive posts 618 can be formed from a conductive metal leadframe having protruded ends 632. Ends of the conductive posts 618 opposite the protruded ends 632 are attached to the component side 628 using the conductive layer 626 that can include a solder, a solder paste, a conductive adhesive, or a combination thereof.

The conductive posts 618 can be positioned on the component side 628 outside a peripheral region of the integrated circuit component 616. A stack encapsulation 634 covers the integrated circuit component 616, the component side 628, and surround each of the conductive posts 618 with the protruded ends 632 of the conductive posts 618 exposed from the stack encapsulation 634. The stack encapsulation 634 can be used to protect the stack package 612 by providing structural support, and hermetically sealing the contents of the stack package 612.

A protrusion width 636 is defined as a maximum cross-sectional width of the protruded ends 632. A post width 638 is defined as a maximum cross-sectional width of the conductive posts 618 in direct contact with the stack encapsulation 634. The protrusion width 636 is less than the post width 638 for each of the conductive posts 618.

The protection layer 624 of etchant resistant materials can be applied directly on the protruded ends 632 using an etching protection layer, an adhesion layer, a diffusion barrier layer, a wet enhancing layer, or any combination thereof. The protection layer 624 can preferably be formed on a top and sides of the protruded ends 632. For example, the etchant resistant materials can include a gold, a nickel a gold, nickel lead gold, or etchant resistant alloys.

A cross-sectional width of the protection layer 624 on the protruded ends 632 can preferably be equal to the post width 638. A side of the stack substrate 622 opposite the component side 628 can be facing and connected to the internal side 208 of the base substrate 102 using stack interconnects 630 that can include solder balls or solder columns having different sizes.

The protection layer 624 on a flat end portion 644 of the protruded ends 632 can be connected or attached to a chip 646, such as a flip chip, over the stack package 612 using the stack interconnects 630. A redistribution metal layer 648 or redistribution layer connected to the protruded ends 632 can be formed on the stack encapsulation 634 between the chip 646 and the stack package 612.

The electronic components 340 can be attached directly to the redistribution metal layer 648 on the stack package 612. The redistribution metal layer 648 can be non-planar. For example, the redistribution metal layer 648 can be applied on a non-planar surface having bumps, depressions, or any surface profile shape.

A package encapsulation 650 can cover the chip 646, the stack package 612, and the internal side 208 of the base substrate 102. The package encapsulation 650 can also be applied between the stack package 612 and the base package 602, the chip 646 and the stack package 612, and surround the protruded ends 632.

The electronic components 340 can also be surrounded by the package encapsulation 650. The package encapsulation 650 can be formed in a manner similar to the stack encapsulation 634 and cover peripheral sides of the stack package 612 and the chip 646.

For purposes of illustration, the stack substrate 622 is shown having a single conductive layer connecting the component side 628 with the side of the stack substrate 622 opposite the component side 628. It is understood that the stack substrate 622 can have any number of conductive layers. For example, the stack substrate 622 can have five conductive layers used to route and connect different areas on the component side 628 with areas on the side of the stack substrate 622 opposite the component side 628.

Figure 7:
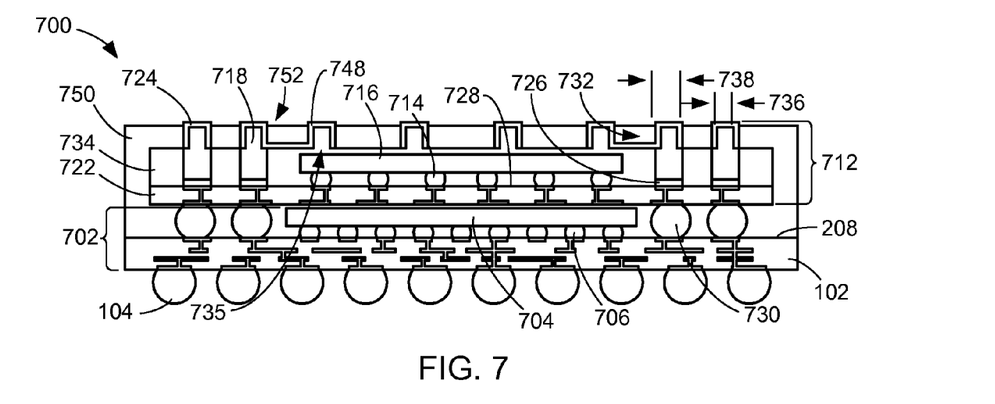
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention. The integrated circuit packaging system 700 includes a base package 702 with the base substrate 102 having the system interconnects 104 exposed on a side of the base substrate 102.

The base package 702 includes an integrated circuit device 704 or a flip chip connected to a side of the base substrate 102 opposite the side of the base package 702 with the system interconnects 104 using device connectors 706 that can include conductive balls or bumps. The device connectors 706 can be formed from a solder material.

The device connectors 706 on a device active side of the integrated circuit device 704 can be directly connected to the internal side 208 of the base substrate 102. The device active side is defined as a side of a die, a module, a package, or an electronic structure having active circuitry fabricated thereon or having elements for connection to the active circuitry within the die, the module, the package, or the electronic structure.

An inactive side of the integrated circuit device 704 opposite the device active side can be facing away from the base substrate 102. The system interconnects 104 attached to a side of the base substrate 102 opposite the internal side 208 can provide connectivity between the integrated circuit packaging system 700 and a next level subsystem (not shown) including a printed circuit board, an integrated circuit package, or an electronic subsystem.

A stack package 712 can be connected directly to the base package 702. The stack package 712 can include circuit connectors 714, an integrated circuit component 716, conductive posts 718, a stack substrate 722, a protection layer 724, and a conductive layer 726.

The integrated circuit component 716 can include a die or flip chip connected to a component side 728 of the stack substrate 722 using the circuit connectors 714, similar to the device connectors 706. The conductive posts 718 can be formed from a conductive metal leadframe having protruded ends 732. Ends of the conductive posts 718 opposite the protruded ends 732 are attached to the component side 728 using the conductive layer 726 that can include a solder, a solder paste, a conductive adhesive, or a combination thereof.

The conductive posts 718 are positioned on the component side 728 outside a peripheral region of the integrated circuit component 716. A stack encapsulation 734 covers the integrated circuit component 716, the component side 728, and surround each of the conductive posts 718 with the protruded ends 732 of the conductive posts 718 exposed from the stack encapsulation 734.

The stack encapsulation 734 can be formed having raised platform areas 735 above the integrated circuit component 716 and projecting away from the stack substrate 722. The raised platform areas 735 can preferably have a shape and size identical to the protruded ends 732. The stack encapsulation 734 can be used to protect the stack package 712 by providing structural support, and hermetically sealing the contents of the stack package 712.

A protrusion width 736 is defined as a maximum cross-sectional width of the protruded ends 732. A post width 738 is defined as a maximum cross-sectional width at any portion of the conductive posts 718 in direct contact with the stack encapsulation 734. The protrusion width 736 is less than the post width 738 for each of the conductive posts 718.

The protection layer 724 of etchant resistant materials can be applied directly on the protruded ends 732 using an etching protection layer, an adhesion layer, a diffusion barrier layer, a wet enhancing layer, or any combination thereof. The protection layer 724 can preferably be formed on a top and sides of the protruded ends 732. For example, the etchant resistant materials can include a gold, a nickel a gold, nickel lead gold, or etchant resistant alloys.

The raised platform areas 735 can include a redistribution metal layer 748 similar to the redistribution metal layer 648 of FIG. 6. The redistribution metal layer 748 of the raised platform areas 735 can be connected to the protection layer 724. A cross-sectional width of the redistribution metal layer 748 of the raised platform areas 735 can preferably be equal to the post width 738.

A cross-sectional width of the protection layer 724 on the protruded ends 732 can preferably be equal to the post width 738. A side of the stack substrate 722 opposite the component side 728 can be facing and connected to the internal side 208 of the base substrate 102 using stack interconnects 730 that can include solder balls or solder columns having different sizes.

A package encapsulation 750 can surround a portion of each of the protruded ends 732, a portion of each of the raised platform areas 735, cover the stack encapsulation 734, and be applied between the stack package 712 and the base package 702. The package encapsulation 750 can be formed in a manner similar to the stack encapsulation 734 and cover peripheral sides of the stack package 712.

The protection layer 724 on an end portion 752 of the protruded ends 732 and the redistribution metal layer 748 of the raised platform areas 735 can be partially or fully exposed above the package encapsulation 750. The protruded ends 732 or the raised platform areas 735 can provide connectivity between the integrated circuit packaging system 700 and the next level subsystem or a further next level subsystem (not shown).

For purposes of illustration, the stack substrate 722 is shown having a single conductive layer connecting the component side 728 with the side of the stack substrate 722 opposite the component side 728. It is understood that the stack substrate 722 can have any number of conductive layers. For example, the stack substrate 722 can have five conductive layers used to route and connect different areas on the component side 728 with areas on the side of the stack substrate 722 opposite the component side 728.

It has been discovered that the conductive posts 718 reduce occurrences of bumped bridging during reflow in comparison to vertical interconnects formed using solder.

Figure 8:
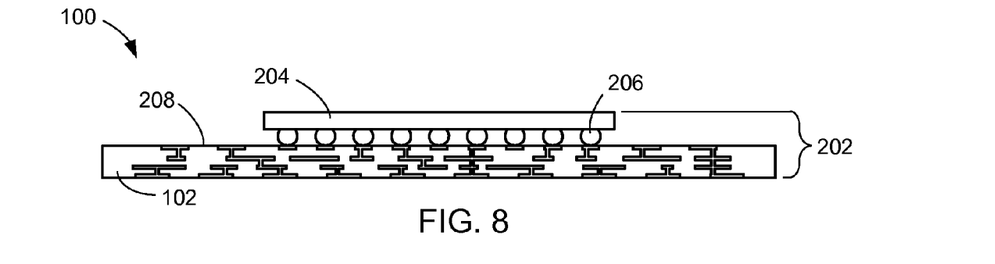
FIG. 8 is a cross-sectional view of the base package of FIG. 1 in an assembly phase.

Referring now to FIG. 8, therein is shown a cross-sectional view of the base package 202 of FIG. 1 in an assembly phase. The integrated circuit device 204 can be electrically attached to the internal side 208 of the base substrate 102 in the assembly phase. The assembly phase can include an attachment process that can include a cleaning process, a reflow process, or a cooling process. The attachment process results in the formation of the base package 202.

Figure 9:
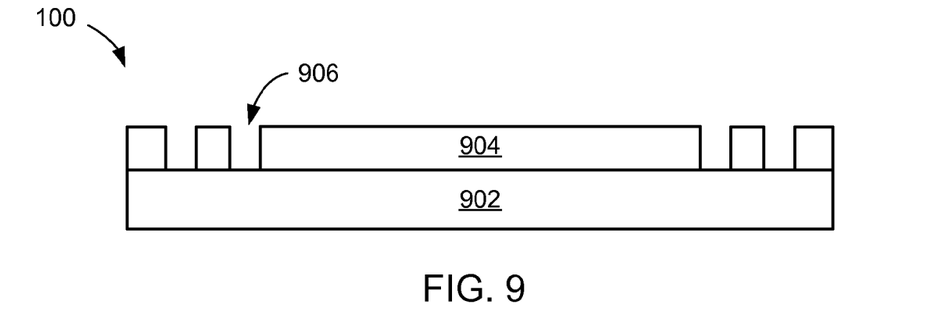
FIG. 9 is a cross-sectional view of FIG. 1 in a leadframe masking phase of manufacture.

Referring now to FIG. 9, therein is shown a cross-sectional view of FIG. 1 in a leadframe masking phase of manufacture. Shown is a conductive panel 902 or a copper panel with a mask layer 904 having openings 906 that expose portions of the conductive panel 902. The openings 906 are preferably formed having a width equal to the post width 238 of FIG. 2.

Figure 10:
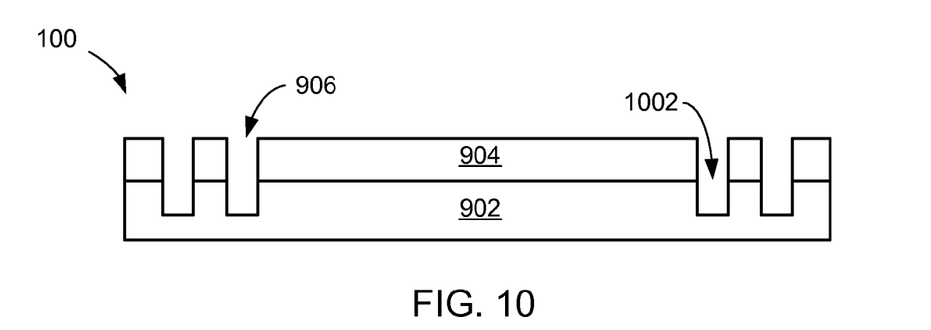
FIG. 10 is the cross-sectional view of FIG. 9 in a removal phase.

Referring now to FIG. 10, therein is shown the cross-sectional view of FIG. 9 in a removal phase. Cavities 1002 are formed in a portion of the conductive panel 902 exposed below each of the openings 906 as a result of the removal phase.

The removal phase can include an etching process or a removal process. The portion of the conductive panel 902 can preferably have a width equal to the post width 238 of FIG. 2.

Figure 11:
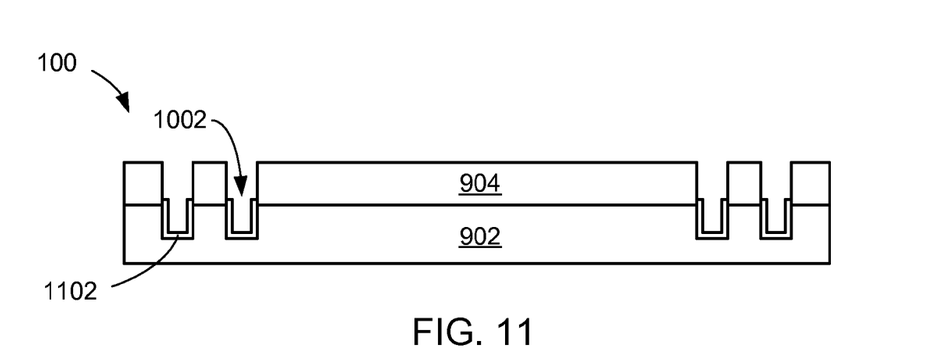
FIG. 11 is the cross-sectional view of FIG. 10 in a layer plating phase.

Referring now to FIG. 11, therein is shown the cross-sectional view of FIG. 10 in a layer plating phase. A conductive etchant resistant layer 1102 can be applied to sides of the conductive panel 902 forming the cavities 1002 during the layer plating phase. The layer plating phase can include a plating process, a cleaning process, a diffusion process, a vaporization process, or a deposition process.

Figure 12:
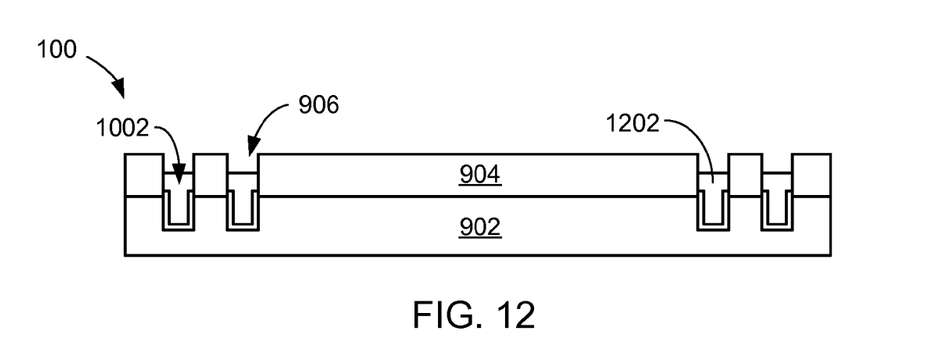
FIG. 12 is the cross-sectional view of FIG. 11 in a post plating phase.

Referring now to FIG. 12, therein is shown the cross-sectional view of FIG. 11 in a post plating phase. Posts 1202 can be formed in the cavities 1002 of the conductive panel 902 and in a portion of the openings 906 of the mask layer 904. The posts 1202 can be formed by a post plating process using the same material as the conductive panel 902 or other conductive materials during the post plating phase. The post plating phase can include a cleaning process, a plating process, or a finishing process.

Figure 13:
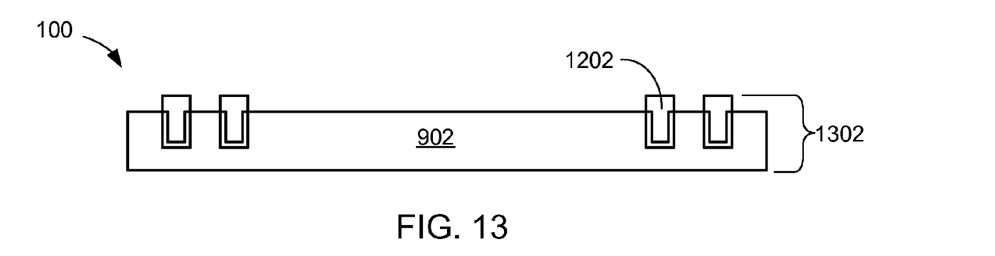
FIG. 13 is the cross-sectional view of FIG. 12 in a mask removal phase.

Referring now to FIG. 13, therein is shown the cross-sectional view of FIG. 12 in a mask removal phase. The mask layer 904 of FIG. 12 can be removed from the conductive panel 902 to expose the posts 1202 protruding from the conductive panel 902 during the mask removal phase.

The mask removal phase can include a mask removal process that can include a chemical stripping process, an ultrasonic cleaning process, or a finishing process. The mask removal phase results in the formation of a leadframe structure 1302.

Figure 14:
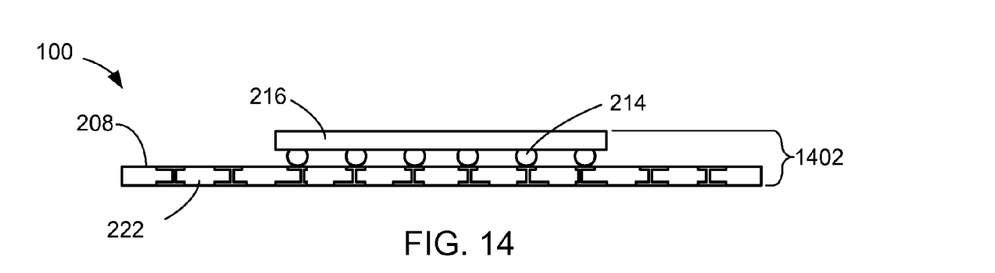
FIG. 14 is the cross-sectional view of FIG. 13 in a chip mounting phase.

Referring now to FIG. 14, therein is shown the cross-sectional view of FIG. 13 in a chip mounting phase. The integrated circuit component 216 can be mounted and connected to the internal side 208 of the stack substrate 222 using the circuit connectors 214 during the chip mounting phase.

The chip mounting phase can include a chip mounting process that can include a cleaning process, a reflow process, a cooling process, or a finishing process. A stack substrate assembly 1402 is formed as a result of the chip mounting process.

Figure 15:
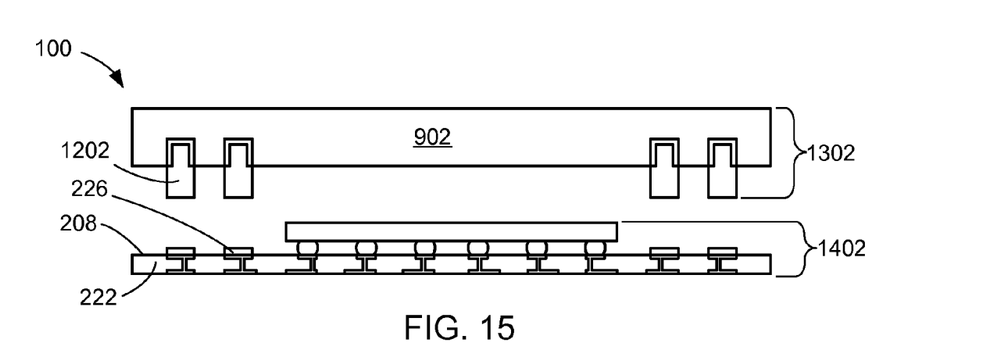
FIG. 15 is the cross-sectional view of FIG. 14 in a leadframe mounting phase.

Referring now to FIG. 15, therein is shown the cross-sectional view of FIG. 14 in a leadframe mounting phase. The leadframe structure 1302 can be attached to the stack substrate assembly 1402 using the conductive layer 226 during the leadframe mounting phase.

The conductive layer 226 can be used to connect an end of the posts 1202 facing away from the conductive panel 902 with the internal side 208 of the stack substrate 222. The leadframe mounting phase can include an attaching process that can include a cleaning process, a reflow process, a cooling process, or a finishing process.

Figure 16:
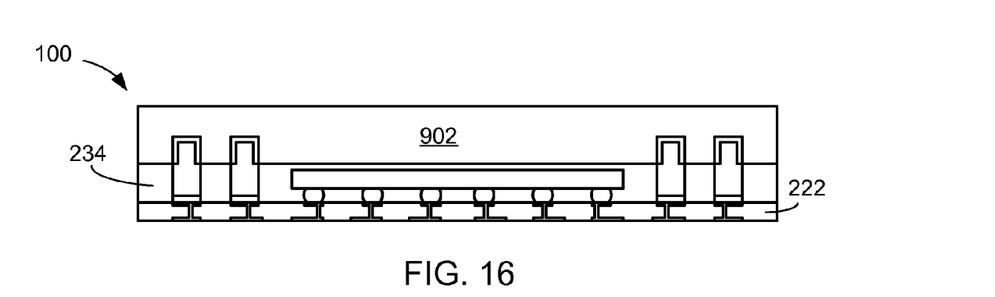
FIG. 16 is the cross-sectional view of FIG. 15 in an encapsulation phase.

Referring now to FIG. 16, therein is shown the cross-sectional view of FIG. 15 in an encapsulation phase. An encapsulant can be applied between the conductive panel 902 and the stack substrate 222 to form the stack encapsulation 234 during the encapsulation phase. The encapsulation phase can include an encapsulation process that can include a mold fixture (not shown), a heating process, a cooling process, or a finishing process.

Figure 17:
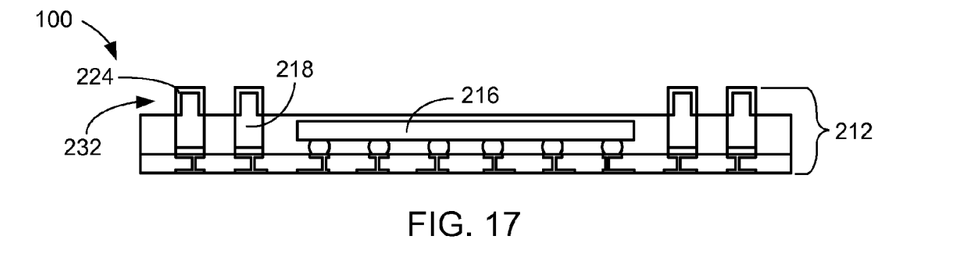
FIG. 17 is the cross-sectional view of FIG. 16 in an etching phase.

Referring now to FIG. 17, therein is shown the cross-sectional view of FIG. 16 in an etching phase. The conductive panel 902 is removed to expose the conductive etchant resistant layer 1102 of FIG. 11 and the stack encapsulation 234 resulting in the formation of the stack package 212 the etching phase.

The stack package 212 is shown with the conductive posts 218 with the protection layer 224 above the integrated circuit component 216. The etching phase can include an etching process that can include an etching process or a removal process.

Figure 18:
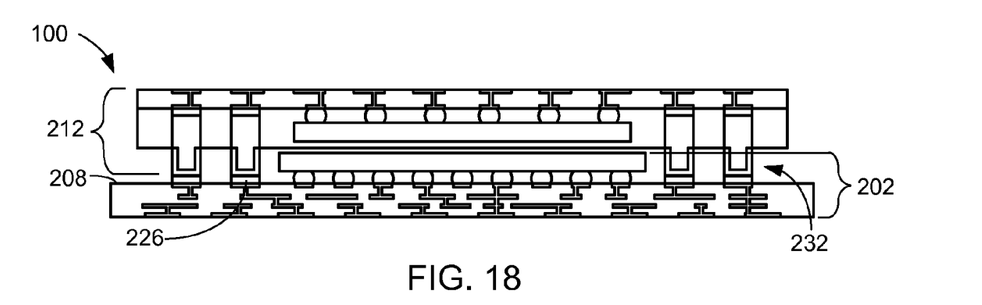
FIG. 18 is the cross-sectional views of FIG. 17 and FIG. 8 in a connecting phase.

Referring now to FIG. 18, therein is shown the cross-sectional views of FIG. 17 and FIG. 8 in a connecting phase. The conductive layer 226 can be attached directly between the protruded ends 232 of the stack package 212 and the internal side 208 of the base substrate 102 during the connection phase. The connection phase can include a connection process that can include a cleaning process, a reflow process, or a cooling process.

Figure 19:
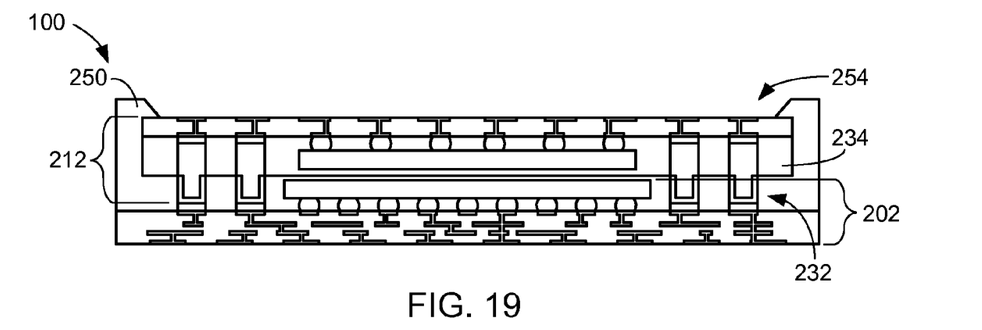
FIG. 19 is the cross-sectional view of FIG. 18 in a further encapsulation phase.

Referring now to FIG. 19, therein is shown the cross-sectional view of FIG. 18 in a further encapsulation phase. The package encapsulation 250 can be applied between the stack package 212 and the base package 202, surrounding each of the protruded ends 232, and covering peripheral sides of the stack package 212 and the stack encapsulation 234 during the further encapsulation phase. The package encapsulation 250 is formed with the cavity 254 during the further encapsulation phase that can include the encapsulation process.

Figure 20:
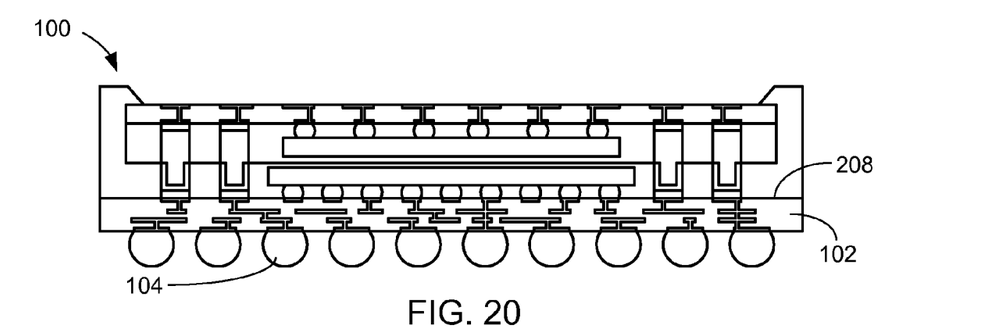
FIG. 20 is the cross-sectional view of FIG. 19 in a connector attaching phase.

Referring now to FIG. 20, therein is shown the cross-sectional view of FIG. 19 in a connector attaching phase. The system interconnects 104 can be attached to a side of the base substrate 102 opposite the internal side 208 of the base package 202 during the connector attaching phase. The attaching phase can include the attaching process.

Figure 21:
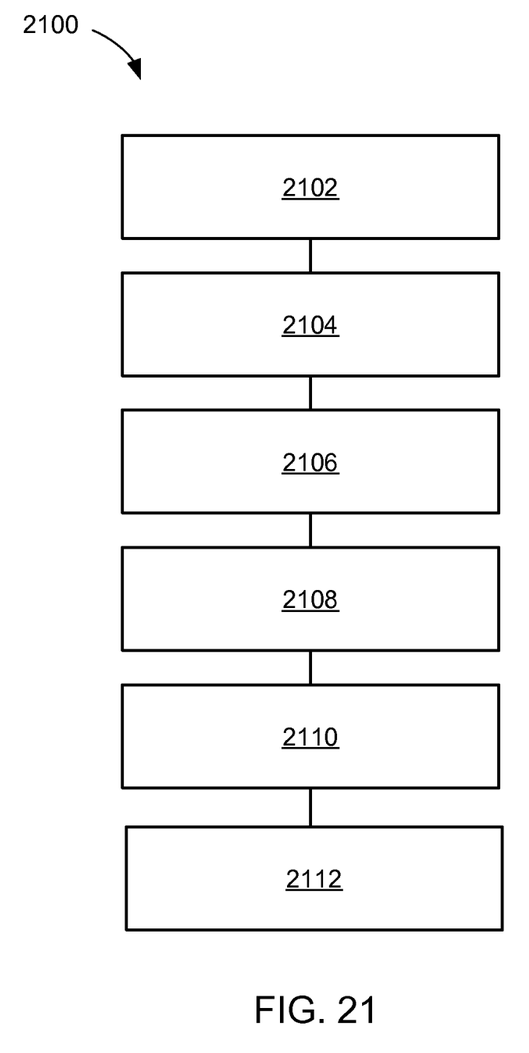
FIG. 21 is a flow chart of a method of manufacture of the integrated circuit packaging system in a further embodiment of the present invention.

Referring now to FIG. 21, therein is shown is a flow chart of a method 2100 of manufacture of the integrated circuit packaging system 100 in a further embodiment of the present invention. The method 2100 includes: providing a stack substrate with a component side in a block 2102; connecting an integrated circuit component to the component side in a block 2104; attaching a conductive post to the component side and adjacent the integrated circuit component, the conductive post having a protruded end above the integrated circuit component in a block 2106; forming a protection layer on a top and sides of the protruded end, the protection layer having a width equal to a width of the conductive post in a block 2108; applying a stack encapsulation over the integrated circuit component, over the stack substrate, and around a portion of the conductive post, the protection layer exposed from the stack encapsulation in a block 2110; and mounting a base package under the stack substrate, base package connected to the stack substrate in a block 2112.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   providing a stack substrate with a component side;
   connecting an integrated circuit component to the component side;
   attaching a conductive post to the component side and adjacent the integrated circuit component, the conductive post having a protruded end above the integrated circuit component;
   forming a protection layer on a top and sides of the protruded end, the protection layer having a width equal to a width of the conductive post;
   applying a stack encapsulation over the integrated circuit component, over the stack substrate, and around a portion of the conductive post, the protection layer exposed from the stack encapsulation; and
   mounting a base package under the stack substrate, base package connected to the stack substrate.

2. The method as claimed in claim 1 further comprising applying a package encapsulation around a portion of the protruded end with the protection layer exposed above the package encapsulation.

3. The method as claimed in claim 1 further comprising attaching a chip to the protection layer over the stack package.

4. The method as claimed in claim 1 further comprising attaching an electronic component to a side of the stack substrate opposite the component side.

5. The method as claimed in claim 1 further comprising forming a redistribution metal layer on the stack package, the redistribution metal layer connected to the protruded end.

6. A method of manufacture of an integrated circuit packaging system comprising:
   providing a stack substrate with a component side;
   connecting an integrated circuit component to the component side;
   attaching a conductive post to the component side and adjacent the integrated circuit component, the conductive post having a protruded end above the integrated circuit component;
   forming a protection layer on the protruded end, the protection layer having a width equal to a width of the conductive post;
   applying a stack encapsulation over the integrated circuit component, over the stack substrate, and around a portion of the conductive post, the protection layer exposed from the stack encapsulation;
   mounting a base package under the stack substrate, base package connected to the stack substrate; and
   applying a package encapsulation over at least a portion of the stack package and between the stack package and the base package.

7. The method as claimed in claim 6 wherein applying the package encapsulation includes forming a cavity in the encapsulation to expose a portion of the stack substrate opposite the component side.

8. The method as claimed in claim 6 wherein applying the stack encapsulation includes forming the stack encapsulation having a raised platform area, the raised platform area connected to the protection layer and partially exposed from the package encapsulation.

9. The method as claimed in claim 6 further comprising attaching a package connector to a side of the stack substrate opposite the component side, the package connector partially exposed from the package encapsulation.

10. The method as claimed in claim 6 further comprising forming a redistribution metal layer on the stack package, the redistribution metal layer connected to the protruded end and exposed from the package encapsulation.

11. An integrated circuit packaging system comprising:
    a stack substrate with a component side;

an integrated circuit component connected to the component side;

a conductive post connected to the component side and adjacent the integrated circuit component, the conductive post having a protruded end above the integrated circuit component;

a protection layer on the protruded end, the protection layer having a width equal to a width of the conductive post;

a stack encapsulation over the integrated circuit component, over the stack substrate, and around a portion of the conductive post, the protection layer exposed from the stack encapsulation; and a base package under the stack substrate, the base package connected to the stack substrate.

12. The system as claimed in claim 11 further comprising a package encapsulation around a portion of the protruded end with the protection layer exposed above the package encapsulation.

13. The system as claimed in claim 11 further comprising a chip attached to the protection layer over the stack package.

14. The system as claimed in claim 11 further comprising an electronic component attached to a side of the stack substrate opposite the component side.

15. The system as claimed in claim 11 further comprising a redistribution metal layer on the stack package, the redistribution metal layer connected to the protruded end.

16. The system as claimed in claim 11 further comprising a package encapsulation over at least a portion of the stack package and between the stack package and the base package.

17. The system as claimed in claim 16 wherein the package encapsulation includes a cavity in the encapsulation to expose a portion of the stack substrate opposite the component side.

18. The system as claimed in claim 16 wherein the stack encapsulation includes the stack encapsulation having a raised platform area, the raised platform area connected to the protection layer and partially exposed from the package encapsulation.

19. The system as claimed in claim 16 further comprising a package connector attached to a side of the stack substrate opposite the component side, the package connector partially exposed from the package encapsulation.

20. The system as claimed in claim 16 further comprising a redistribution metal layer on the stack package, the redistribution metal layer connected to the protruded end and exposed from the package encapsulation.

* * * * *